(12) United States Patent
Lauer et al.

(10) Patent No.: US 9,373,638 B1
(45) Date of Patent: Jun. 21, 2016

(54) COMPLEMENTARY METAL-OXIDE SILICON HAVING SILICON AND SILICON GERMANIUM CHANNELS

(71) Applicant: International Business Machines Corporation, Armonk, NY (US)

(72) Inventors: Gen P. Lauer, Yorktown Heights, NY (US); Isaac Lauer, Yorktown Heights, NY (US); Alexander Reznicek, Troy, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/597,918

(22) Filed: Jan. 15, 2015

(51) Int. Cl.
*H01L 21/00* (2006.01)
*H01L 27/12* (2006.01)
*H01L 21/8238* (2006.01)
*H01L 21/84* (2006.01)
*H01L 21/324* (2006.01)
*H01L 21/3065* (2006.01)
*H01L 21/02* (2006.01)
*H01L 27/092* (2006.01)
*H01L 29/06* (2006.01)
*H01L 29/161* (2006.01)
*H01L 29/78* (2006.01)
*G05B 19/19* (2006.01)

(52) U.S. Cl.
CPC ............ *H01L 27/1203* (2013.01); *G05B 19/19* (2013.01); *H01L 21/02532* (2013.01); *H01L 21/3065* (2013.01); *H01L 21/324* (2013.01); *H01L 21/8238* (2013.01); *H01L 21/84* (2013.01); *H01L 27/0922* (2013.01); *H01L 29/0649* (2013.01); *H01L 29/161* (2013.01); *H01L 29/7849* (2013.01); *G05B 2219/45032* (2013.01); *H01L 29/785* (2013.01)

(58) Field of Classification Search
CPC ............ H01L 29/785; H01L 21/02532; H01L 21/3065; H01L 21/324; H01L 21/8238; H01L 21/84; H01L 27/0922; H01L 29/0649; H01L 29/161; H01L 29/7849
See application file for complete search history.

(56) References Cited

U.S. PATENT DOCUMENTS

| | | | |
|---|---|---|---|
| 7,220,626 B2 * | 5/2007 | Zhu | ..................... H01L 21/84 257/E21.633 |
| 7,427,779 B2 | 9/2008 | Damlencourt et al. | |
| 7,785,995 B2 | 8/2010 | Cody et al. | |
| 8,053,301 B2 | 11/2011 | Jaeger et al. | |

(Continued)

FOREIGN PATENT DOCUMENTS

JP        2007-88400 A        4/2007

*Primary Examiner* — Nicholas Tobergte
(74) *Attorney, Agent, or Firm* — Scott A. Berger; Louis J. Percello

(57) ABSTRACT

A silicon germanium on insulator (SGOI) wafer having nFET and pFET regions is accessed, the SGOI wafer having a silicon germanium (SiGe) layer having a first germanium (Ge) concentration, and a first oxide layer over nFET and pFET and removing the first oxide layer over the pFET. Then, increasing the first Ge concentration in the SiGe layer in the pFET to a second Ge concentration and removing the first oxide layer over the nFET. Then, recessing the SiGe layer of the first Ge concentration in the nFET so that the SiGe layer is in plane with the SiGe layer in the pFET of the second Ge concentration. Then, growing a silicon (Si) layer over the SGOI in the nFET and a SiGe layer of a third concentration in the pFET, where the SiGe layer of a third concentration is in plane with the grown nFET Si layer.

12 Claims, 12 Drawing Sheets

(56) References Cited

U.S. PATENT DOCUMENTS

| | | |
|---|---|---|
| 8,492,208 B1 | 7/2013 | Cohen et al. |
| 8,564,025 B2 | 10/2013 | Bangsaruntip et al. |
| 8,574,981 B2 * | 11/2013 | Flachowsky ...... H01L 21/02532 257/E21.438 |
| 8,575,655 B2 | 11/2013 | Bedell et al. |
| 8,633,573 B2 | 1/2014 | Jain et al. |
| 2007/0205408 A1 | 9/2007 | Damlencourt et al. |
| 2013/0175503 A1 | 7/2013 | Cohen et al. |
| 2013/0285118 A1 | 10/2013 | Majumdar et al. |
| 2015/0263093 A1 * | 9/2015 | Lee ............. H01L 29/785 438/285 |
| 2015/0340500 A1 * | 11/2015 | Brunco ............ H01L 21/02532 257/190 |

* cited by examiner

COMPLEMENTARY METAL-OXIDE SILICON HAVING SILICON AND SILICON GERMANIUM CHANNELS

BACKGROUND

Aspects of the present disclosure relate to FinFET device structures, and more particular aspects relate to making Fin-FETs having p-channel field-effect transistor (pFET) and n-channel field effect transistor (nFET) regions.

As complementary metal-oxide silicon (CMOS) semiconductor devices and manufacturing processes become smaller, following the trend to reduce the size of channel nodes, channel mobility of electrons becomes more difficult. Different channel materials may be utilized in complementary nFET and pFET devices in order to create controllable, reliable semiconductor devices. Utilizing various techniques, silicon (Si) and silicon germanium (SiGe) content in various regions may be carefully controlled, allowing for reliable and efficient semiconductor device fabrication and structures.

SUMMARY

Embodiments of the present disclosure provide for a method, system, and FET device structure.

One embodiment is directed toward a method. The method includes accessing a silicon germanium on insulator (SGOI) wafer having an nFET region and a pFET region, where the SGOI wafer has a silicon germanium (SiGe) layer of a first germanium (Ge) concentration, the SGOI wafer having a first oxide layer over the nFET and pFET regions. The method also includes removing the first oxide layer over the pFET region in response to accessing the SGOI wafer. The method also includes increasing the first Ge concentration in the SiGe layer of the first Ge concentration in the pFET region to a second Ge concentration in response to removing the first oxide layer over the pFET region. The method also includes removing the first oxide layer over the nFET region in response to increasing the first Ge concentration in the SiGe layer of the first Ge concentration in the pFET region. The method also includes recessing the SiGe layer of the first Ge concentration in the nFET region so that the SiGe layer in the nFET region is in plane with the SiGe layer of the second Ge concentration in the pFET region in response to removing the first oxide layer over the nFET region. The method also includes growing a silicon (Si) layer over the SGOI wafer in the nFET region in response to recessing the SiGe layer of the first Ge concentration in the nFET region. The method also includes growing a SiGe layer of a third concentration in the pFET region in response to growing a Si layer over the nFET region, wherein the SiGe layer of a third concentration is in plane with the grown Si layer in the nFET region.

Another embodiment is directed toward a system. The system includes a fabrication apparatus. The system also includes a fabrication controller. The fabrication controller is communicatively coupled to the fabrication apparatus. The fabrication controller is configured to cause the fabrication apparatus to form a silicon germanium on insulator (SGOI) wafer having nFET and pFET regions by accessing a silicon on insulator (SOI) wafer. The fabrication controller is further configured to cause the fabrication apparatus to form a SGOI wafer having nFET and pFET regions by growing a first silicon germanium (SiGe) layer on the SOI wafer. The fabrication controller is further configured to cause the fabrication apparatus to form a SGOI wafer having nFET and pFET regions by condensing the first SiGe layer on the SOI wafer and stripping resulting oxide layer from SiGe. The fabrication controller is further configured to cause the fabrication apparatus to grow a silicon (Si) layer over the nFET region in response to the fabrication apparatus forming the SGOI wafer having nFET and pFET regions. The fabrication controller is further configured to cause the fabrication apparatus to deposit a second oxide mask over the nFET and pFET regions in response to the fabrication apparatus growing the Si layer over the nFET region. The fabrication controller is further configured to cause the fabrication apparatus to strip the second oxide mask layer over the pFET region in response to the fabrication apparatus depositing a second oxide mask over the nFET and pFET regions. The fabrication controller is further configured to cause the fabrication apparatus to grow a second SiGe layer over the pFET region in response to the fabrication apparatus stripping the second oxide mask layer over the pFET region. The fabrication controller is further configured to cause the fabrication apparatus to strip the second oxide mask over the nFET region in response to the fabrication apparatus growing the second SiGe layer over the pFET region.

Another embodiment is directed toward a FET device. The FET device includes a silicon germanium on insulator (SGOI) wafer having an nFET region and a pFET region, wherein the nFET region includes a Si layer located above a $Si_xGe_{1-x}$ layer; wherein the pFET region includes a $Si_zGe_{1-z}$ layer located above a $Si_yGe_{1-y}$ layer; and wherein the $Si_yGe_{1-y}$ layer has a germanium (Ge) content equal to or greater than the $Si_xGe_{1-x}$ layer, and the $Si_zGe_{1-z}$ layer has a Ge content greater than the $Si_yGe_{1-y}$ layer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
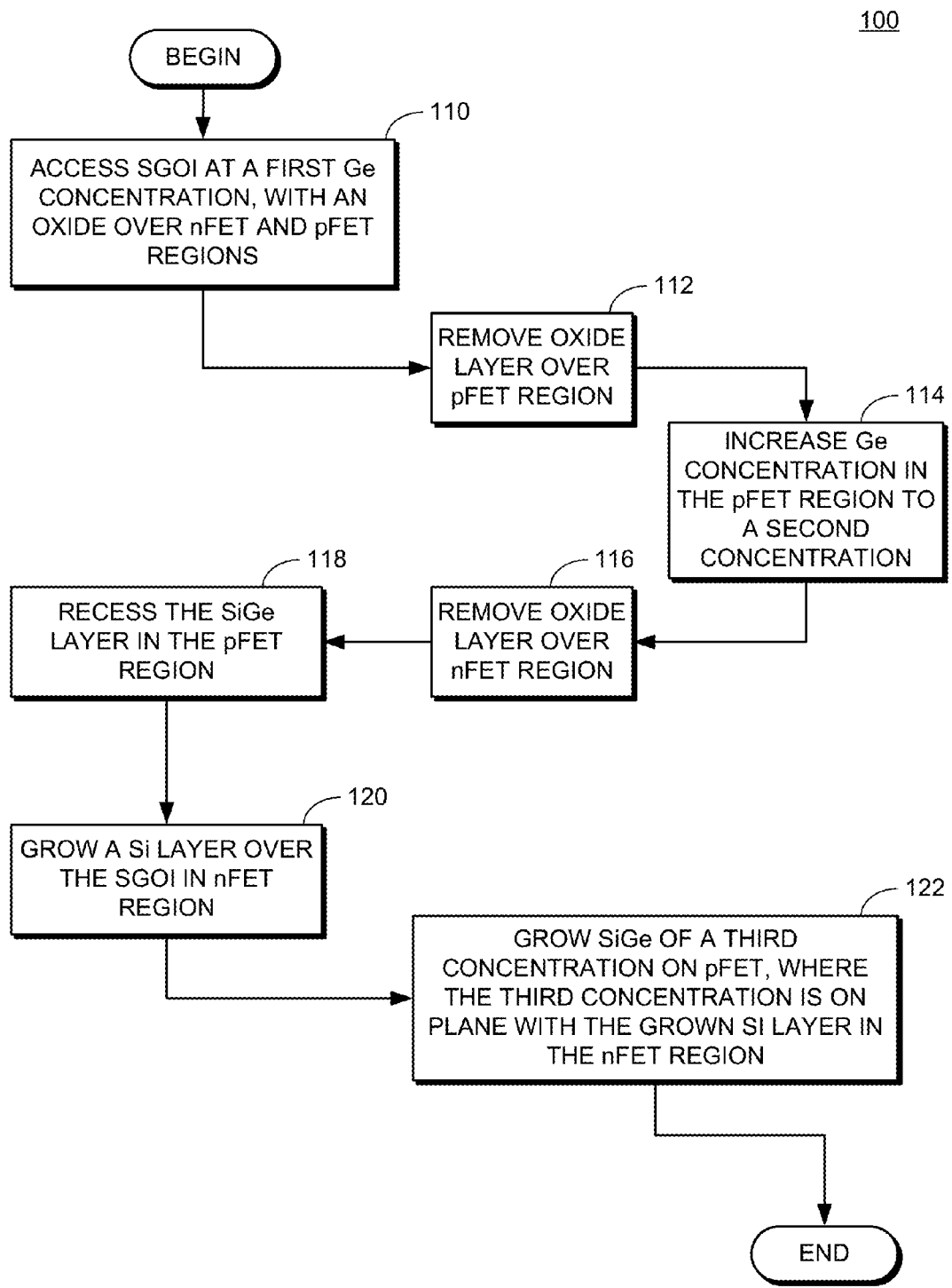
FIG. 1 depicts a FET fabrication process flowchart, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to FinFET device structures, and more particular aspects relate to making Fin- FETs having p-channel field-effect transistor (pFET) and n-channel field-effect transistor (nFET) regions.

In a complementary metal-oxide silicon (CMOS) FET fabrication process, a silicon-germanium-on-insulator (SGOI) wafer may be accessed, the wafer having nFET and pFET regions and an oxide mask layer over the nFET and pFET regions. The oxide layer over the pFET region may be removed, followed by increasing the starting (first) concentration of the germanium (Ge), to a second Ge concentration, in the SiGe layer below. The oxide mask layer remaining over the nFET region may then be removed, and the SiGe layer in the pFET region may be recessed to the level of the SiGe in the nFET region giving the pFET and nFET regions substantially equal heights. Then, a Si layer may be grown over the SiGe in the nFET region, and another SiGe layer with a Ge content of a third concentration may be grown over the pFET region, in plane with the grown Si layer in the nFET region.

While the present disclosure is not necessarily limited to such applications, various aspects of the disclosure may be appreciated through a discussion of various examples using this context.

The use of Ge channel devices has become prevalent in technologies for the 32 nm node and forward. This use of Ge channel devices is sometimes referred to as channel SiGe or "cSiGe." The pFET channel being SiGe may be desirable for multiple reasons, including work function setting, mobility, and reliability (e.g., significant negative-bias temperature instability [NBTI] reduction when compared to other, more conventional, semiconductive materials, such as Si). The use of strained Si for mobility enhancement is also prevalent in planar technologies for enhancing channel mobility and overall device performance. Different stressors may be required for complementary nFET and pFET devices.

Described herein, the use of an epitaxial structure, such as one having different Si and SiGe regions may be beneficial. For example, an epitaxial structure having $Si/Si_xGe_{1-x}$ in the nFET region and $Si_zGe_{1-z}/Si_yGe_{1-y}$ for the pFET region, where the Ge content for pFET region (z) is greater than the SiGe content of the pFET suspension SiGe layer (y) and the Ge content for nFET suspension region (x) is less than the SiGe content of the pFET suspension SiGe layer (y), may be employed. The variables x, y, and z are representative of atomic ratios, and therefore may each be defined by values between zero and one, according to various embodiments. Differentially etching the high content SiGe x layer selectively over the lower content pFET SiGe y layer and nFET Si layer may permit simultaneous suspension of the nFET and pFET silicon channels. As the etch selectivity typically varies exponentially with Ge content atomic percentages, in terms of an atomic ratio (or fraction), a 10% difference in Ge atomic ratio (e.g., atomic percentages of y=0.2 (20%), x=0.3 (30%)) may suffice for adequate selectivity. By using a relaxed release layer, both tensile strain on an nFET channel as well as compressive strain on a pFET channel may be achieved.

According to various embodiments, a final device structure, as described herein, may notably include three SiGe layers and one Si layer, with one Si and one SiGe layer in the nFET region and two SiGe layers in the pFET region. For various reasons, tensile and compressive strain may be desirable within the nFET and pFET regions. To allow the desired tensile strain in the nFET region and compressive strain in the pFET region, for example, the nFET bottom layer may be relaxed to a larger (i.e., less dense) lattice constant than to which the nFET top layer chemical (i.e., atomic) percent would relax. According to various embodiments, as the nFET top layer is Si, the relaxation of the Si is zero. The pFET bottom layer, according to various embodiments, may be relaxed to a smaller lattice constant (i.e., more dense) than to which the pFET top layer would fully relax. In other words, the bottom layer equivalent strain percentage may be lower than the chemical percentage of the top layer in the pFET region. For example, region x may be relaxed 30%, region may be chemically 50%, but strained 20%. The pFET channel region z may be chemically 60% and under compressive strain, and the nFET Si channel region may be under tensile strain.

When a process flow, as described herein, has completed, the resulting nFET and pFET regions may be processed as normal as known by those skilled in the art, and the nFET and pFET may be released at the same time, according to various embodiments.

FIG. 1 depicts a FET fabrication process flowchart 100, according to various embodiments.

A process may begin and at operation 110, a fabrication apparatus may access an SGOI at a first Ge concentration, having an oxide layer over the nFET and pFET regions at operation 110. The fabrication apparatus may create the SGOI wafer by accessing a base Si layer, depositing a buried oxide (BOX) layer on the Si layer, and growing a SiGe layer on the BOX layer. Alternatively, the fabrication apparatus may form the SGOI by accessing a silicon on insulator (SOI) wafer, growing a SiGe layer on the SOI wafer, condensing the SiGe layer, depositing an oxide layer on the SiGe layer; and removing (e.g., by patterning or stripping) the oxide layer from above the SiGe layer.

According to various embodiments, patterning may use processes including photolithography and optical masks to print patterns that guide the deposition or removal of material from a wafer at specific steps in the fabrication process of a device. At each layer of the device, material may be deposited or removed in those areas not covered by the mask and then a new mask is used for the next layer. The wafer may be repeatedly processed in this fashion, creating multiple layers of circuitry.

According to various embodiments, stripping may refer to a process in which a wafer enters a so-called developer process during which the weakened photoresist may be removed, helping to transfer patterns onto an oxide, such as silicon dioxide. Various wet and dry etch processes exist that may treat the exposed silicon dioxide; wet processes use chemical substances and dry processes use gases. The removal of the remaining photoresist is called strip. Dry and wet strippers may be employed to make sure that the photoresist is completely removed. As photoresists are organic materials, which, if not properly removed, may cause defects on the wafer.

The SGOI wafer may also be formed using a Smart Cut® or similar process. Smart Cut® is a registered U.S. trademark owned by the SOITEC Corporation. A Smart Cut® process typically involves the transfer of mono-crystalline layers of wafer substrate material (such as Si) onto another surface, such as a mechanical support. The transfer may be oxide-oxide molecular bonding and may use atomic-level cleaving to transfer the mono-crystalline Si films on the partially or fully processed wafer. The Si films may be as thin as 0.1 micron or less. The process may occur at a low temperature. A Smart Cut® process may differ from traditional layer-transfer techniques, which may be based mainly on wafer bonding and etch-back or epitaxial lift-off, the Smart Cut® approach may use a thermal activation process as an "atomic scalpel," slicing the wafer horizontally, lifting off a thin layer from the donor substrate and placing it on a new substrate.

The fabrication apparatus may then remove the oxide layer over the pFET at operation 112. The Ge concentration in the pFET regions may be increased to a second Ge concentration at operation 114, for example by condensation of the Ge. The fabrication apparatus may then remove the oxide layer over the nFET region at operation 116. The fabrication apparatus may then recess the SiGe layer in the pFET region at operation 118. The SiGe layer in the pFET region may be recessed, e.g., down to the plane of the SiGe layer in the nFET region.

The fabrication apparatus may grow a Si layer over the SGOI in the nFET region at operation 120. The fabrication apparatus may grow SiGe of a third concentration in the pFET region, the SiGe being in plane with the grown Si layer in the nFET region at operation 122.

Figure 2:
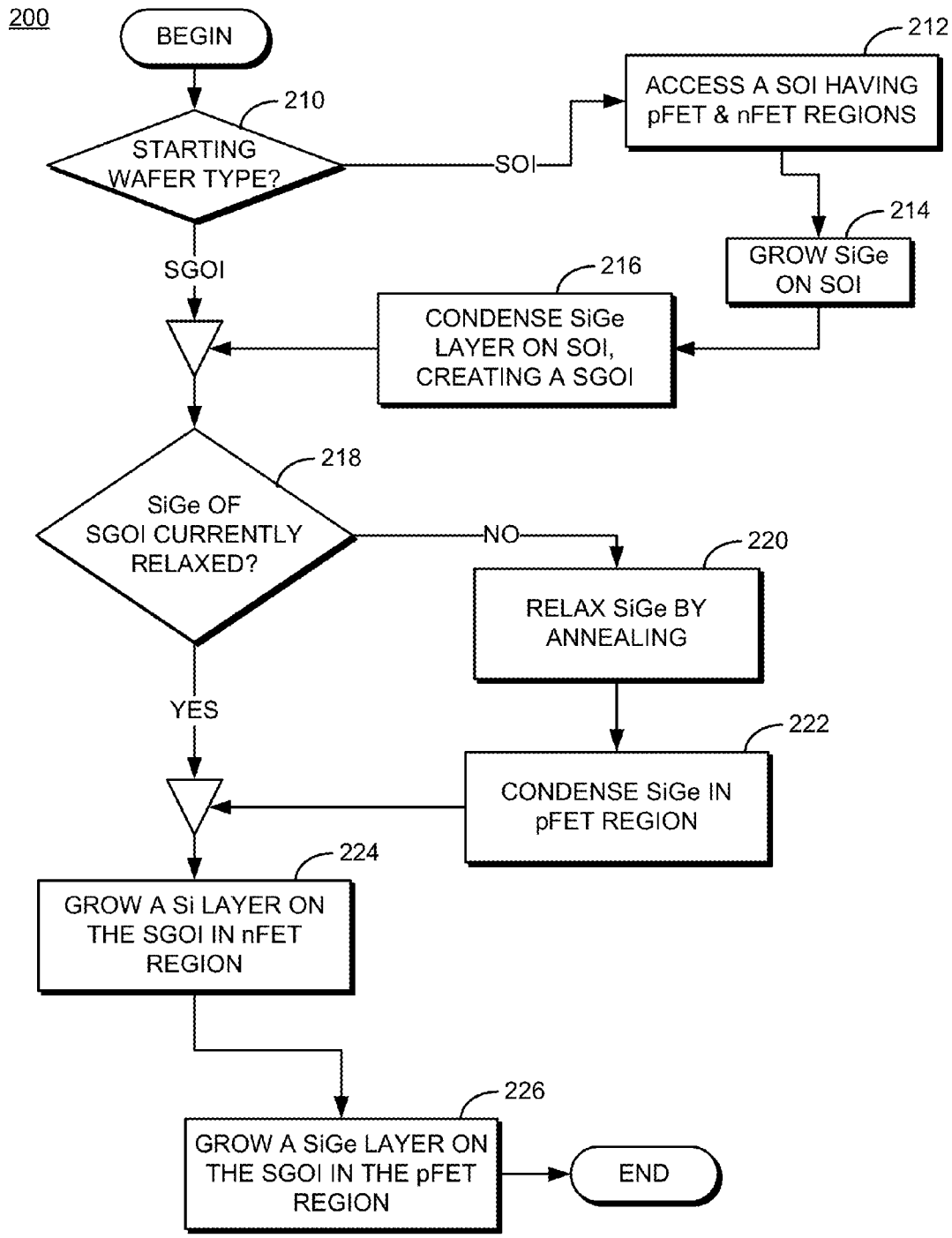
FIG. 2 depicts a FET fabrication process flowchart, according to various embodiments.

FIG. 2 depicts a FET fabrication process flowchart 200, according to various embodiments. FIG. 2 includes optional operations that may be skipped under certain circumstances, according to various embodiments.

The process may begin and a fabrication apparatus may determine a starting wafer type at operation 210. If the starting wafer is determined to be an SGOI having nFET and pFET regions, the process may directly advance to operation 218. An SGOI may be made by a wafer bonding process, according to various embodiments. If the fabrication apparatus determines the starting wafer type to be an SOI, the accessed SOI may have pFET and nFET regions at operation 212. The fabrication apparatus may then grow SiGe on the SOI wafer at operation 214. Once the SiGe is grown on the SOI wafer, the fabrication apparatus may condense the SiGe layer, creating an SGOI at operation 216. The grown SiGe may be a first SiGe layer. According to various embodiments, the fabrication apparatus may condense the first SiGe layer on the SOI wafer and the resulting oxide layer may be removed from the SiGe.

Various embodiments may include the fabrication apparatus accessing an SGOI wafer having nFET and pFET regions, wherein the SGOI wafer has a SiGe layer having a first germanium (Ge) concentration, the SGOI wafer having a first oxide layer over nFET and pFET regions.

Having an SGOI wafer, the fabrication apparatus may determine whether the SiGe layer of the SGOI is currently relaxed at operation 218. Relaxation of a substance generally involves rearrangement of constituent chemical atoms into a natural, or relaxed, lattice. During doping and other processes, atoms of various chemicals may become intermixed with random or irregular lattices. Relaxation generally serves to normalize lattice structure and spacing. If the SiGe layer of the SGOI is currently relaxed, advance to operation 224. If the SiGe layer of the SGOI is not currently relaxed, relax the SiGe layer by annealing to 700-1250° C., at operation 220, as described herein. The fabrication apparatus's condensation or thermal mixing may affect relaxed state of the SiGe. Bonded SGOI wafer may need to be annealed, according to various embodiments. After the SiGe is relaxed, the SiGe layer in the pFET region may be condensed at operation 222. An oxide layer may be formed on the SiGe as a result of the condensation. Generally, condensation may occur prior to deposition of any Si channel layer to avoid unwanted reactions.

If the SiGe layer of the SGOI is relaxed, the fabrication apparatus may grow a Si layer on the SGOI in the nFET region at operation 224. Then, a second SiGe layer may be grown on the SGOI in the pFET region at operation 226 and the process may end.

Figure 3:
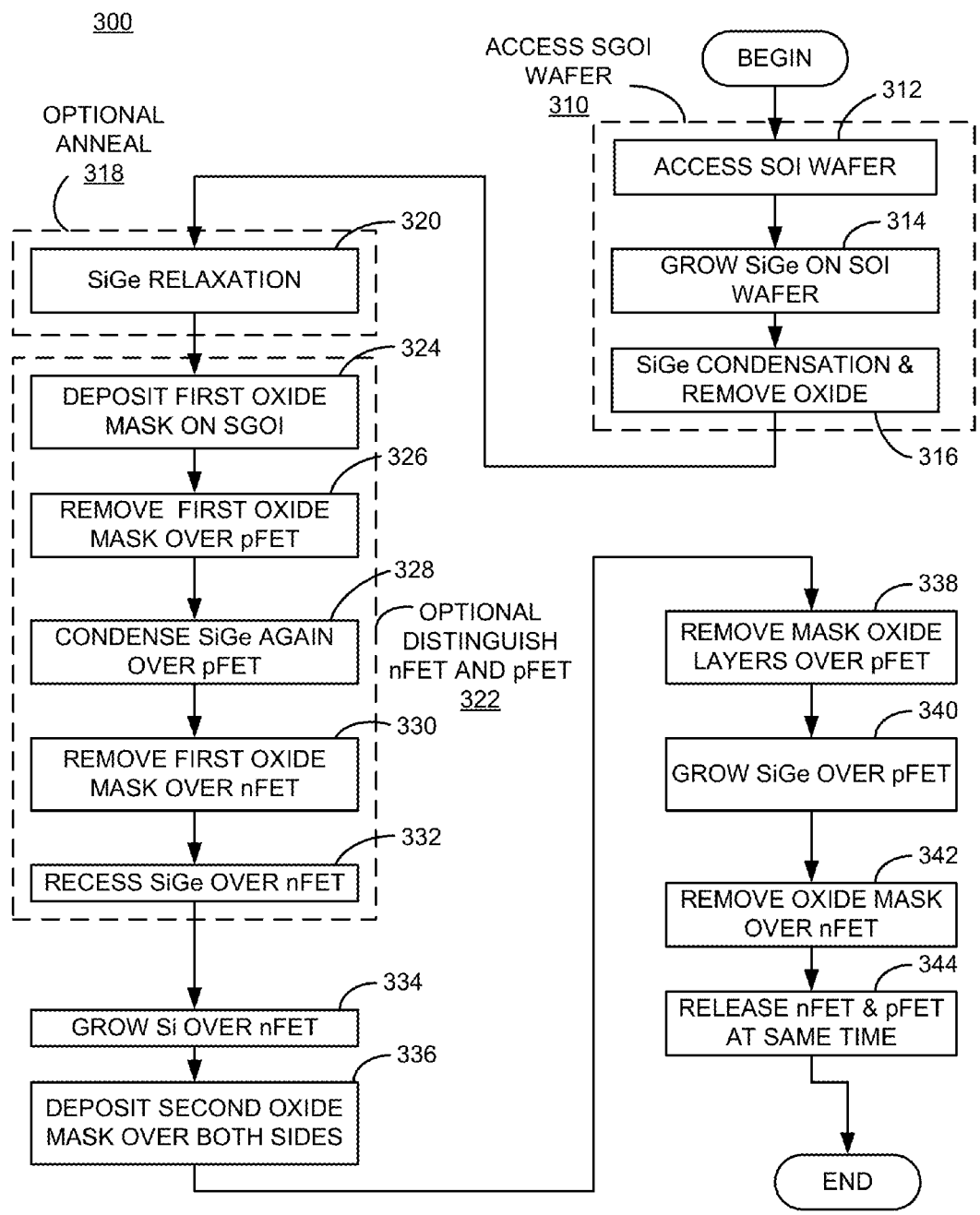
FIG. 3 depicts a FET fabrication process flowchart, according to various embodiments.

FIG. 3 depicts a FET fabrication process flowchart 300, according to various embodiments.

The process 300 may begin and a fabrication apparatus may access an SGOI wafer at operation 310. The fabrication apparatus may first access the SGOI wafer an SOI wafer at operation 312. Then, the fabrication apparatus may grow SiGe on the SOI wafer at operation 314. Finally, the fabrication apparatus may condense the SiGe and the resulting oxide layer may be removed at operation 316.

According to various embodiments, the fabrication apparatus may cause an optional annealing may occur at operation 318. The annealing may include relaxation of the first SiGe layer at operation 320. The nFET and pFET regions of the first SiGe layer of the first Ge concentration of the SGOI wafer may be relaxed, according various embodiments. Relaxing of the first SiGe layer may be accomplished by the fabrication apparatus heating or annealing the first SiGe layer to a temperature around 700 to 1250° C.

According to various embodiments, a series of steps may optionally distinguish the nFET and pFET regions at operation 322. The fabrication apparatus may deposit a first oxide mask on the SGOI at operation 324. The fabrication apparatus may remove the first oxide mask layer over the pFET at operation 326. The fabrication apparatus may also remove the first oxide mask layer over the pFET region in response to accessing the SGOI wafer. The fabrication apparatus may remove the oxide mask layer, e.g., by stripping or patterning.

The method 300 may also include the fabrication apparatus increasing the first Ge concentration in the SiGe layer in the pFET region to a second Ge concentration in response to removing the first oxide layer over the pFET region. The fabrication apparatus may increase the GE concentration of the SiGe by condensing the SiGe layer over the pFET region at operation 328. Then, the fabrication apparatus may remove the first oxide mask over the nFET region at operation 330. Removing the first oxide layer over the nFET may be accomplished, e.g., by stripping or patterning.

The fabrication apparatus may then recess the SiGe layer over the nFET at operation 332. Recessing the SiGe layer of the first Ge concentration in the pFET region may be done such that that the SiGe layer is in plane with the condensed SiGe layer in the pFET region of the second Ge concentration. Recessing the SiGe layer of the first Ge concentration in the pFET region is accomplished by a hydrogen chloride (HCl) gas etch, wet etch, or reactive ion etching (RIE) process.

A gas etch, or plasma etch, process is a form of plasma processing. It generally involves a high-speed stream of glow discharge (e.g., plasma) of an appropriate gas mixture being shot at a target to be etched. The plasma source can be charged or neutral, according to various embodiments. The plasma, when shot, may generate volatile etch products from the chemical reactions between the elements of the material etched and the reactive species generated by the plasma. Eventually, the atoms of the shot target may embed themselves at or just below the target, modifying the physical properties of the target, causing an etch to occur.

A wet etch process uses liquid-phase etchants. A wafer to be etched may be immersed in a bath of etchant, which may be agitated to achieve adequate process control. An example of a wet etchant is buffered hydrofluoric acid (BHF), which is commonly used to etch silicon dioxide ($SiO_2$) over a Si substrate. Wet etchants are generally isotropic, which may lead to a large bias when etching thick films. If immersion is not used for the wet etch, single wafer machines may employ a gas to cushion and protect one side of the wafer while etching is applied to the other side, according to various embodiments.

Reactive ion etching (RIE) generally uses chemically reactive plasma to remove material deposited on wafers. The plasma is generated under low pressure (vacuum) by an electromagnetic field. High-energy ions from the plasma may then attack the wafer surface and react with it, causing an etch to occur.

The fabrication apparatus may then grow Si over the nFET region of the SGOI wafer at operation 334. The fabrication apparatus may then deposit a second oxide mask over nFET and pFET regions at operation 336. The fabrication apparatus may remove the first and second oxide mask layers over the pFET region at operation 338. The fabrication apparatus may grow SiGe over the pFET region at operation 340. The grown SiGe layer may be of a third concentration in the pFET region, where the SiGe layer of a third concentration is in plane with the grown Si layer in the nFET region at operation 334.

The fabrication apparatus may remove the second oxide mask over the nFET at operation 342. Finally, the fabrication apparatus may release the nFET and pFET at the same time at operation 344. The release may occur by etching sacrificial material (typically oxide), from the inside of the structure (in this case, FETs). The process releases the nFET and the pFET from each other, which were originally supported by a sacrificial material.

Figure 4:
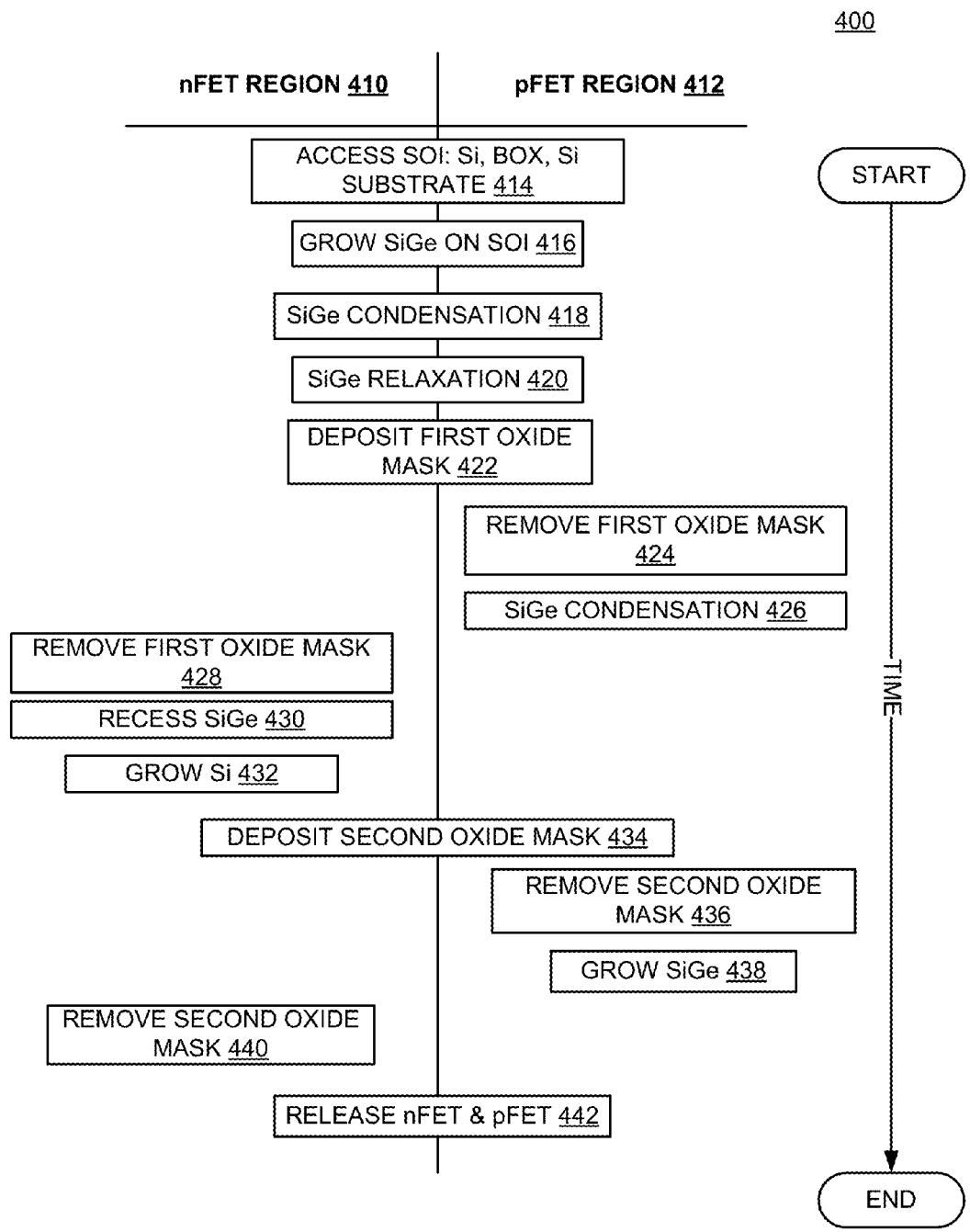
FIG. 4 depicts a FET fabrication process diagram, according to various embodiments.

FIG. 4 depicts a FET fabrication process diagram, according to various embodiments. Placement of various steps according to this embodiments in nFET region column 410 and pFET region column 412 indicate in what areas of the semiconductor device a particular step is taking place.

A fabrication apparatus may access an SOI, BOX and Si substrate at operation 414 (nFET and pFET regions). The fabrication apparatus may grow a SiGe layer on the SOI at operation 416 (nFET and pFET regions). The SiGe layer (grown at operation 416) may be condensed by the fabrication apparatus at operation 418 (nFET and pFET regions). The fabrication apparatus may relax the SiGe layer at operation 420 (nFET and pFET regions). The fabrication apparatus may deposit an oxide mask at operation 422 (nFET and pFET regions).

The fabrication apparatus may then remove the oxide mask over the pFET region at operation 424, which may expose the SiGe layer. The fabrication apparatus may then condense the SiGe layer in the pFET region at operation 426. The fabrication apparatus may then remove the oxide mask in the nFET region at operation 428. The fabrication apparatus may then recess the SiGe layer in the nFET region, as described herein, at operation 430. The fabrication apparatus may then grow a Si layer in the nFET region at operation 432.

The fabrication apparatus may deposit a second oxide mask at operation 434 (nFET and pFET regions). The fabrication apparatus may then remove the second oxide mask in the pFET region at operation 436. The fabrication apparatus may then grow SiGe in the pFET region at operation 438. The fabrication apparatus may remove the second oxide mask in the nFET region at operation 440. Finally, the nFET and pFET regions may be released at operation 442, according to various embodiments.

Figure 5A:
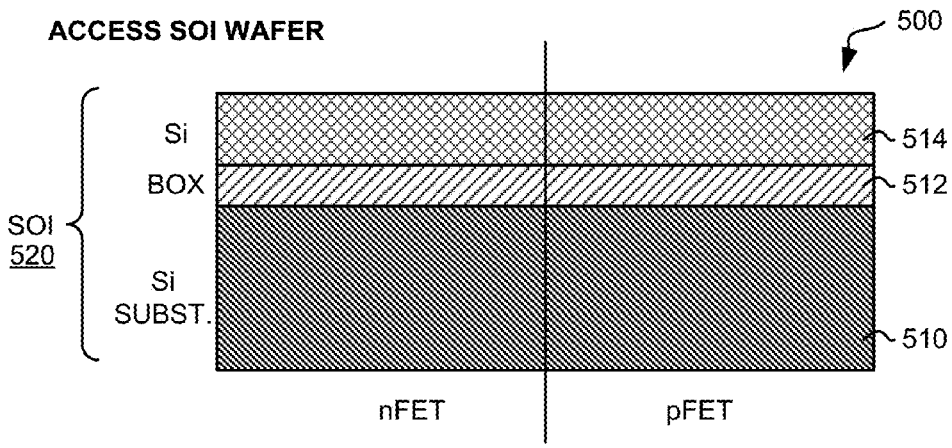
FIG. 5A-5P depict steps in a FET fabrication process flow and a final structure, according to various embodiments.
Figure 5B:
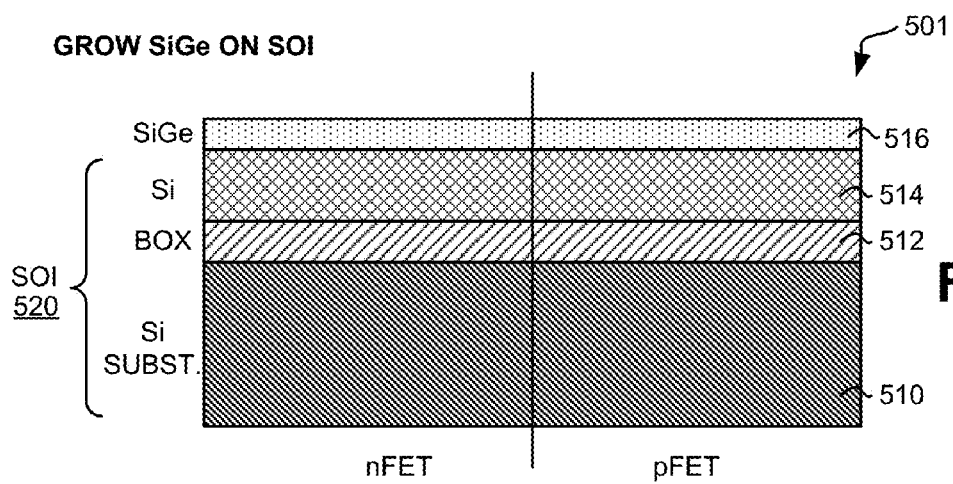
Figure 5C:
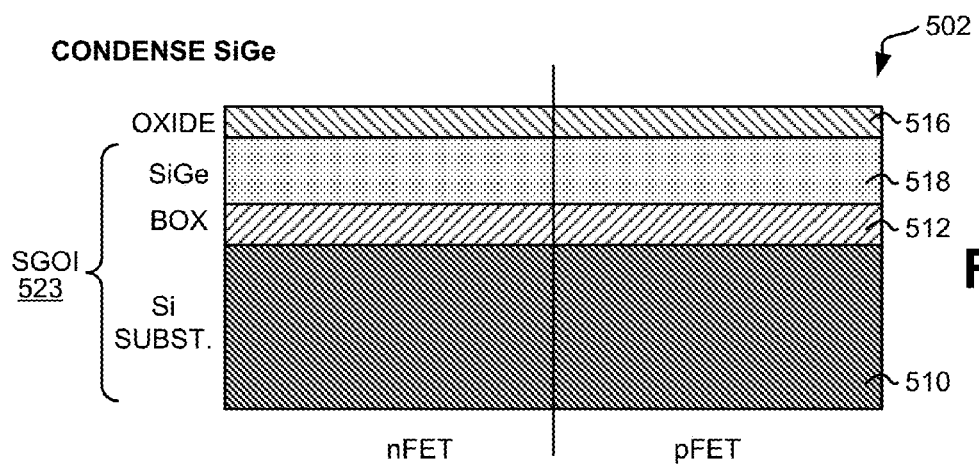
Figure 5D:
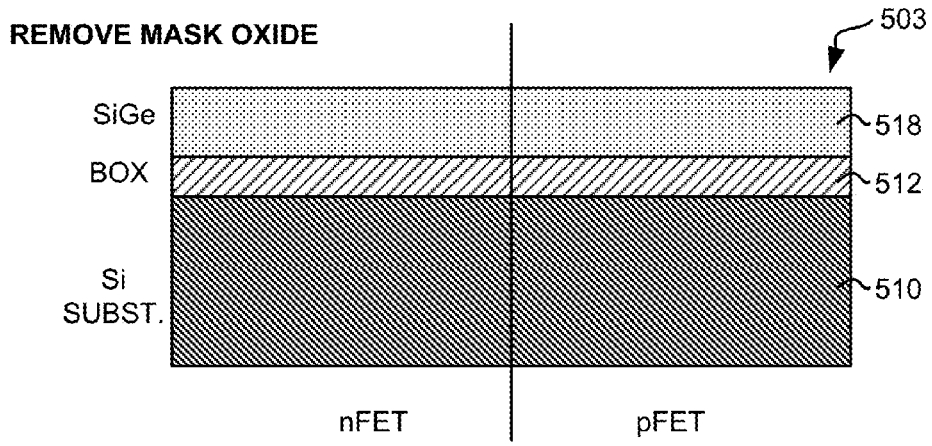
Figure 5E:
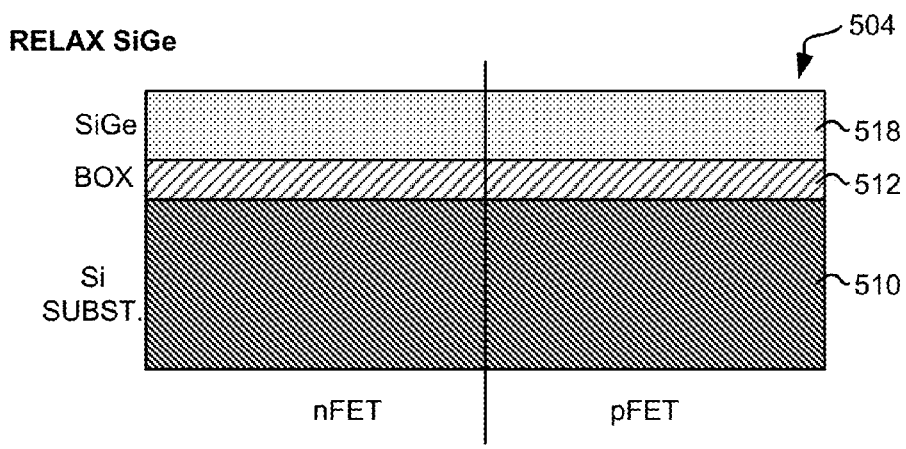
Figure 5F:
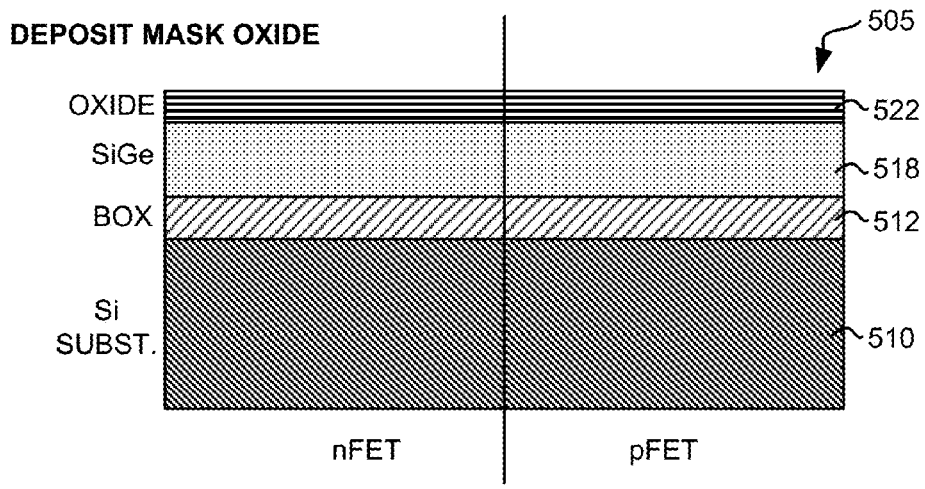
Figure 5G:
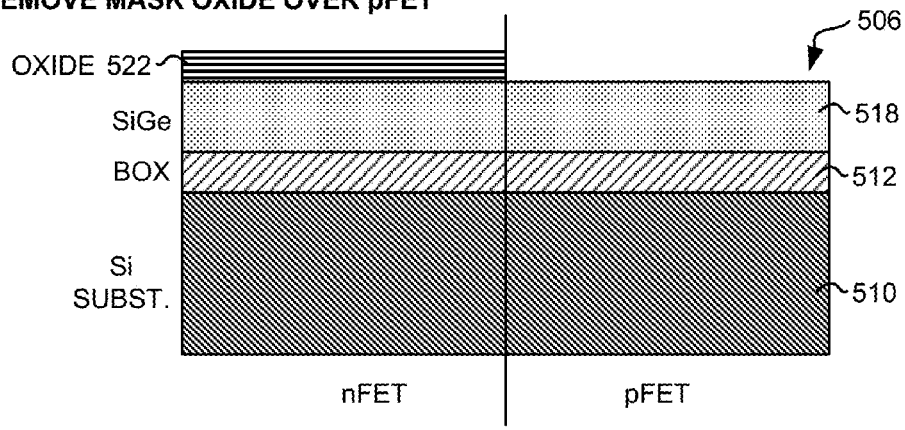
Figure 5H:
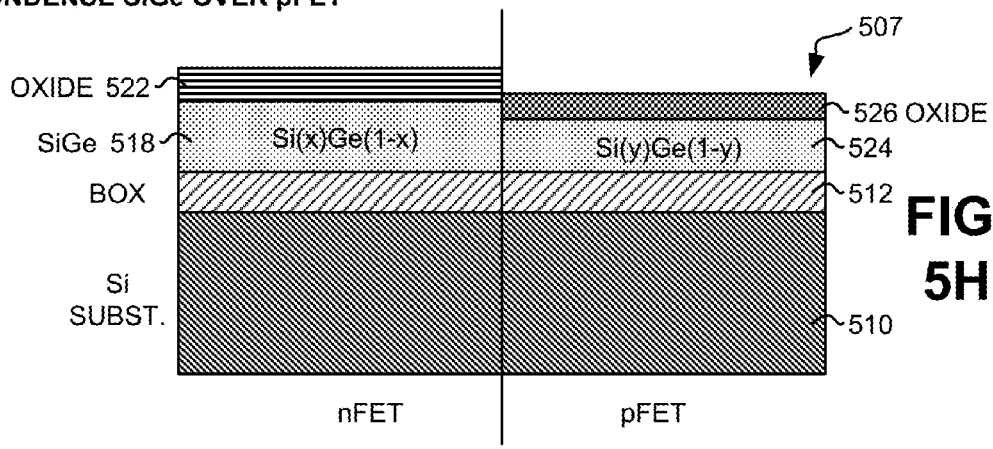
Figure 5I:
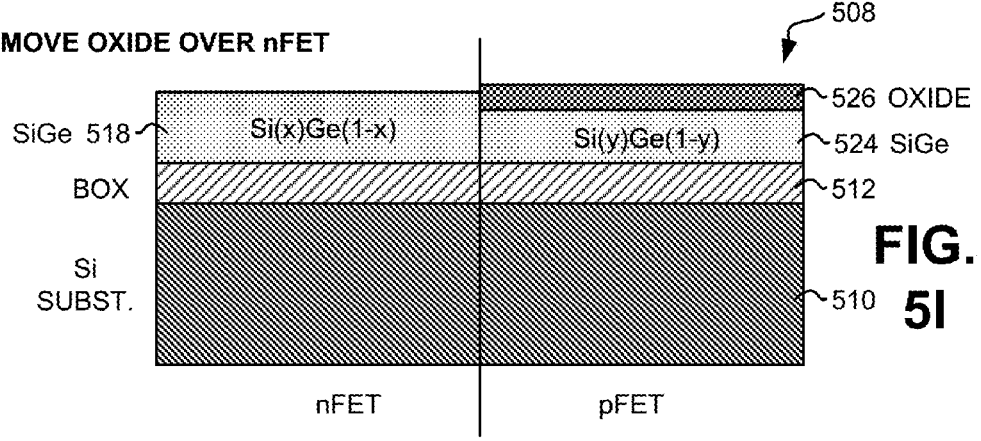
Figure 5J:
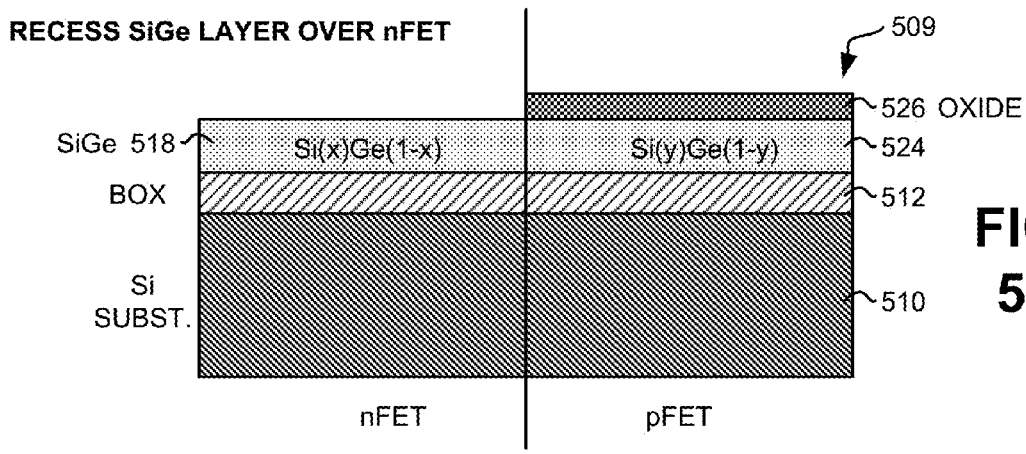
Figure 5K:
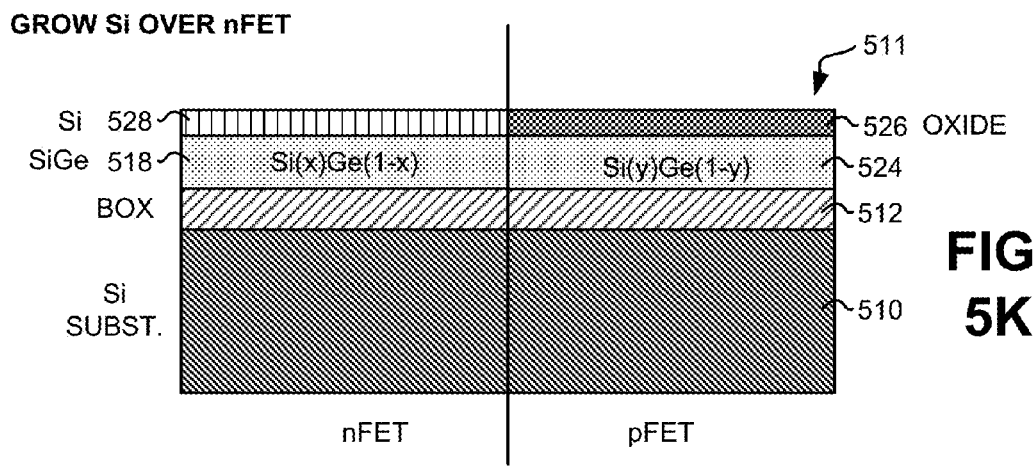
Figure 5L:
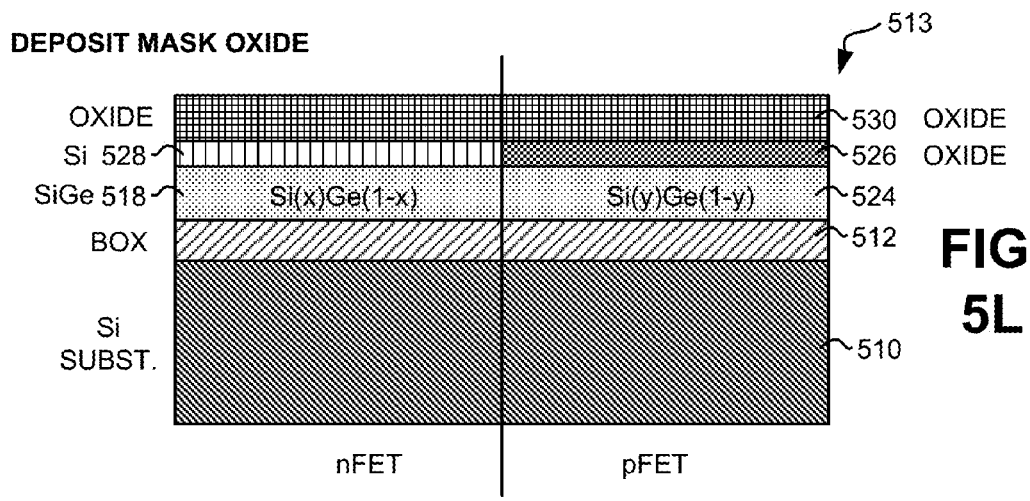
Figure 5M:
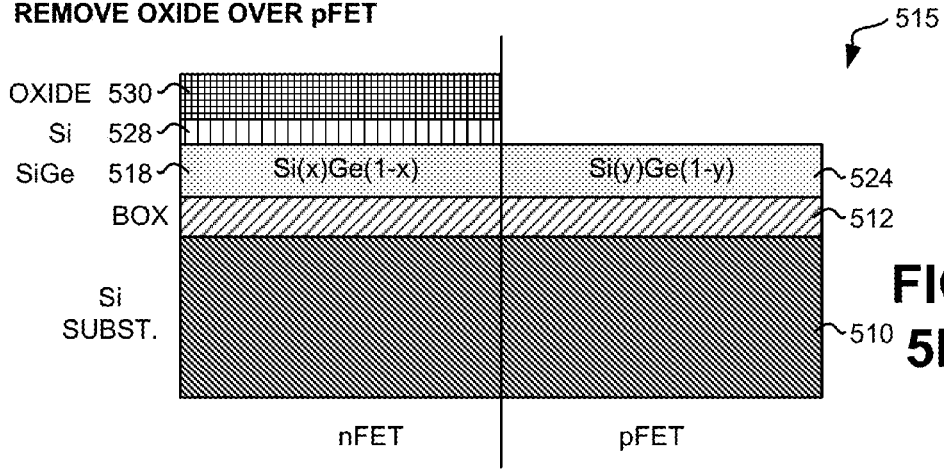
Figure 5N:
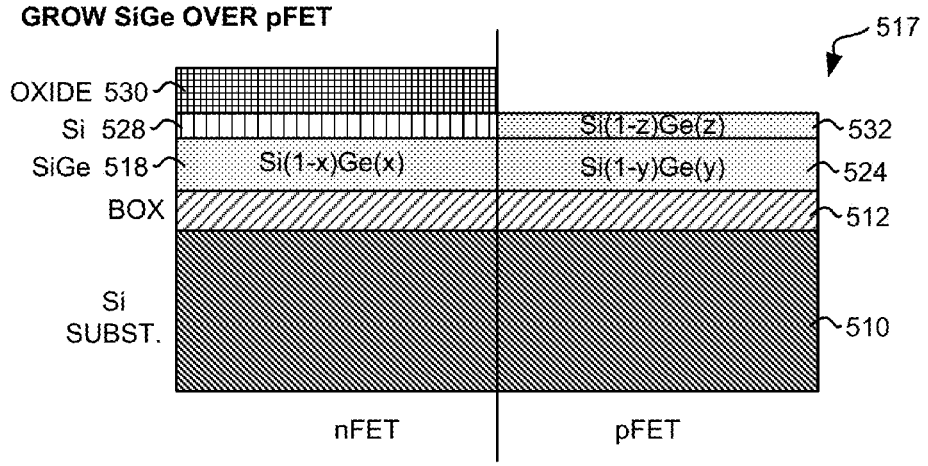
Figure 5O:
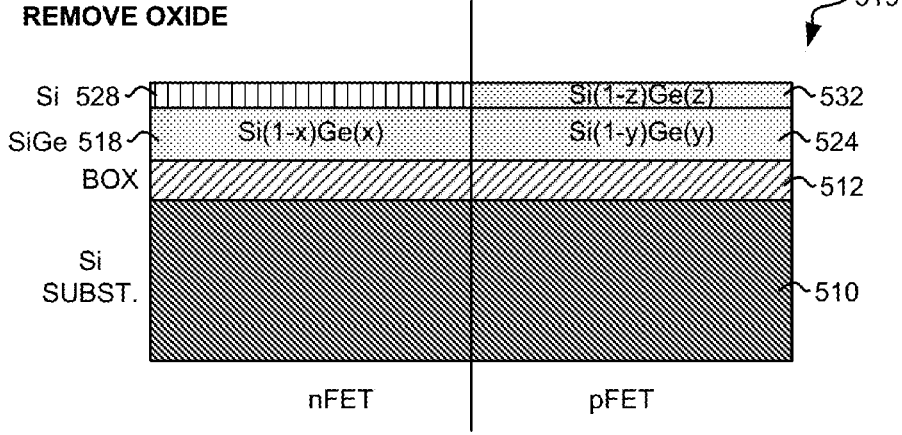
Figure 5P:
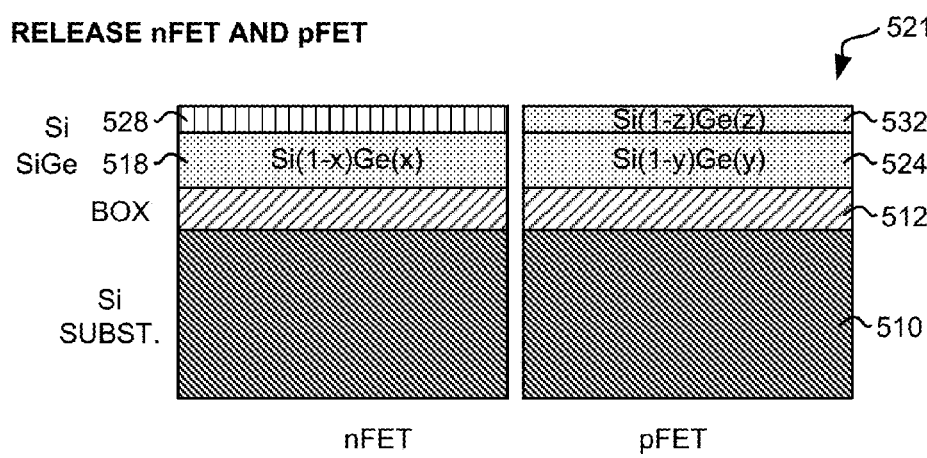

FIG. 5A-5P depict steps in a FET fabrication process flow and a final structure, according to various embodiments.

Referring to FIG. 5A, structure 500 in an example process flow is provided, which includes accessing an SOI wafer. The SOI wafer 520 may include various parts, including a Si substrate 510, a buried oxide layer (BOX) 512 and a Si channel layer 514.

Referring to FIG. 5B, structure 501 includes an SOI wafer, (Si substrate 510, a buried oxide layer (BOX) 512 and a Si channel layer 514), where a SiGe layer 516 is grown on the Si channel layer 514 of the SOI wafer 520.

Referring to FIG. 5C, structure 502 includes condensing the SiGe layer 516 on the SOI wafer, creating an SGOI wafer 523. The SGOI wafer contains a Si substrate 510, a BOX 512, a SiGe layer 518 and an oxide layer 516, formed during condensation. The condensation may be triggered by a detection that the SiGe layer has been grown on the SOI, as depicted in FIG. 5B. The SiGe layer may be represented by the atomic formula $Si_{1-x1}Ge_{x1}$, according to various embodiments, where X1 is a relative number defined herein.

Referring to FIG. 5D, structure 503 includes removing the oxide layer (oxide mask) 516, leaving an SGOI wafer. The removal may be accomplished by various means, including, but not limited to, stripping or patterning the oxide mask.

Referring to FIG. 5E, structure 504 includes relaxing the SiGe layer 518 (of the SGOI 523) by annealing the SiGe layer to 700 to 1250° C., according to various embodiments. In various embodiments, operation 504 may be comparable to operation 318 of FIG. 3.

Referring to FIG. 5F, structure 505 includes depositing an oxide mask layer 522 on the SiGe layer 518 of the SGOI.

Referring to FIG. 5G, structure 506 includes patterning the oxide mask 522 over the pFET region down to the SiGe layer 518.

Referring to FIG. 5H, structure 507 includes condensing the SiGe layer over the pFET region, creating a SiGe layer with a high atomic ratio of Ge 524 and an oxide layer 526. The nFET region, including SiGe layer 518, may be unaffected by the condensation. The new SiGe layer over the pFET region may be represented by the formula $Si_yGe_{1-y}$, where Y is a relative number defined herein.

Referring to FIG. 5I, structure 508 includes removing the oxide 522 over the nFET region, leaving SiGe 518 exposed.

Referring to FIG. 5J, structure 509 includes recessing the SiGe layer 518 over the nFET region such that the SiGe layer 518 is substantially equal in height to the SiGe layer 524. The oxide layer 526 may be higher than the SiGe layer 518, according to various embodiments.

Referring to FIG. 5K, structure 511 includes growing a Si channel layer 528 over the nFET region. The grown Si layer may be grown such that the height of the Si layer 528 is substantially equal to that of the oxide layer 526.

Referring to FIG. 5L, structure 513 includes depositing another oxide mask layer 530 over both nFET and pFET regions.

Referring to FIG. 5M, structure 515 includes removing oxide layers 526 and 530 over pFET region, leaving SiGe layer 524 exposed in the pFET region.

Referring to FIG. 5N, structure 517 includes growing a SiGe layer of a third Ge concentration 532 over the nFET region, on top of the SiGe layer of the second Ge concentration 524. The SiGe layer of the third concentration 532 may be grown such that it is substantially equal in height to the Si layer 528 in the nFET region.

Referring to FIG. 5O, structure 519 includes removing (e.g., by patterning or stripping) the oxide layer 530 over the nFET region, leaving the Si layer 528 exposed. According to various embodiments, the structure 519 may represent an example final semiconductor device structure before release. The structure may include a SGOI wafer having nFET and pFET regions; the nFET region including a Si layer 528 located above a $Si_xGe_{1-x}$ layer 518; the pFET region including a $Si_zGe_{1-z}$ layer 532 located above a $Si_yGe_{1-y}$ layer 524. The $Si_yGe_{1-y}$ layer 524 may have a germanium (Ge) content equal to or greater than the $Si_xGe_{1-x}$ layer 518, and the $Si_zGe_{1-z}$ layer 532 may have a Ge content greater than the $Si_yGe_{1-y}$ layer 524.

The Ge content of $Si_zGe_{1-z}$ may be greater than the Ge content of $Si_yGe_{1-y}$ by about 10 atomic percent. The Ge content of $Si_yGe_{1-y}$ may be greater than the Ge content of $Si_xGe_{1-x}$ by about 10 atomic percent. The Ge content of $Si_xGe_{1-x}$ may also be greater than the Ge content of the Si layer by about 10 atomic percent.

Referring to FIG. 5P, structure 521 includes releasing the nFET and pFET regions. A fabrication apparatus may release the nFET and pFET at the same time. The release may occur by etching sacrificial material (typically oxide), from the inside of the structure (in this case, FETs). The process releases the nFET and the pFET from each other, which were originally supported by a sacrificial material (not shown).

Figure 6:
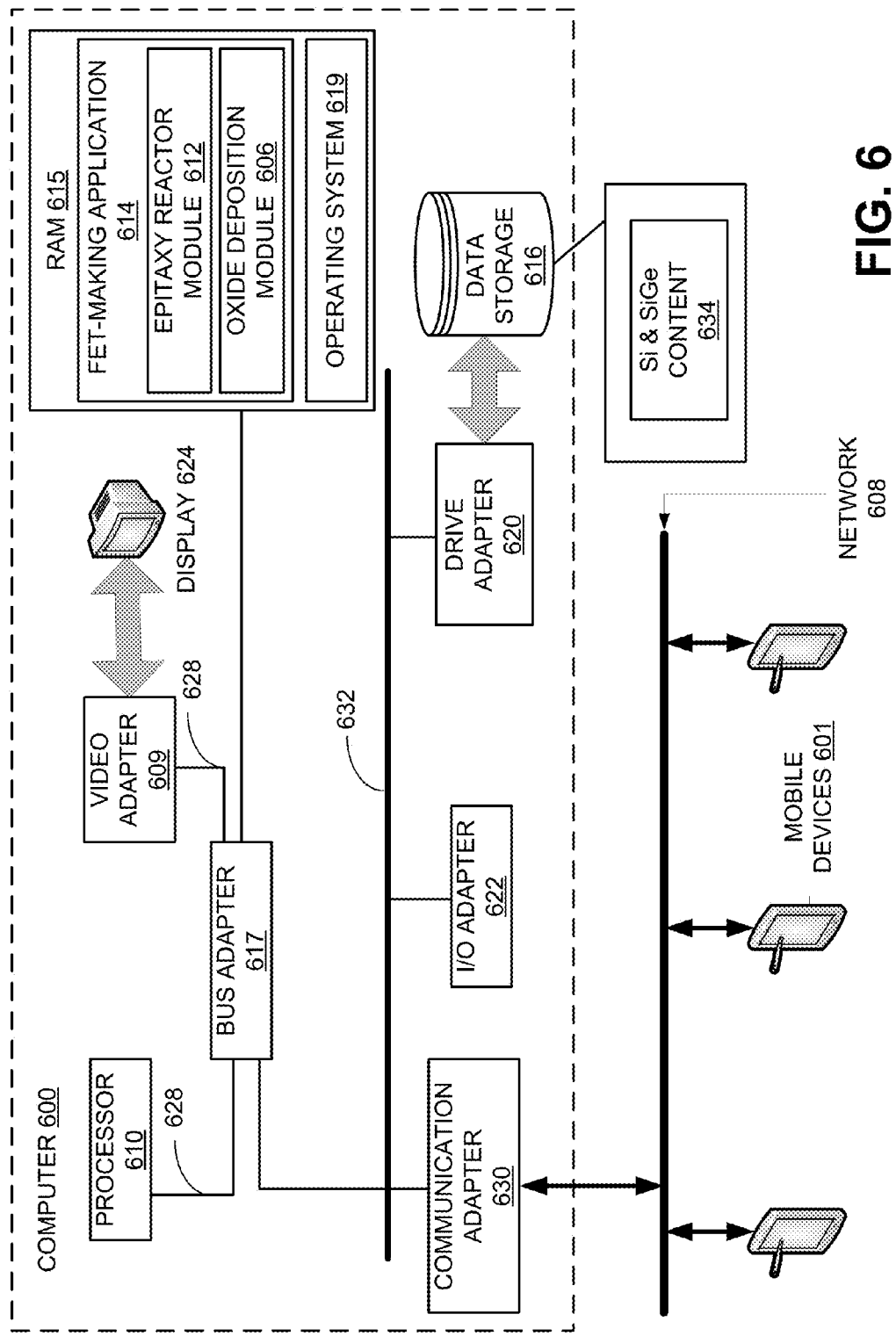
FIG. 6 depicts a block diagram of automated computing machinery, according to various embodiments.

FIG. 6 depicts a block diagram of automated computing machinery, according to various embodiments. The computing machinery may include example computer 600 useful in performing aspects of the disclosure, according to various embodiments. The computer 600 may be coupled to or contain a fabrication controller, according to various embodiments, as described herein. The computer 600 of FIG. 6 includes at least one computer processor 610 or central processing unit (CPU) as well as random access memory 615 (RAM) which is connected through bus adapter 617 to processor 610 and to other components of the computer 600. The computing machinery or the processor 610 may include one or more computer processing circuits.

The RAM 615 may include a FET-making application 614. The FET-making application may access or control various functions of the computer's 600 RAM 615, according to various embodiments. The FET-making application's instructions and Si & SiGe content info 634 may be stored to or read from data storage 616, which may be a hard disk drive, according to various embodiments. The memory controller's communications may be received from various modules located in the RAM 615.

The RAM 615 may include an epitaxy reactor module 612. The epitaxy reactor module's 612 instructions may be populated into the data storage 616. The FET-making application 614 may control when to deposit various layers during a fabrication process. The FET-making application 614 may also work in conjunction with the fabrication apparatus described herein. The FET-making application may access an oxide deposition module 606 and an epitaxy reactor module 612, according to various embodiments. The oxide deposition module 606 may control oxide deposition during a FET-making process, according to various embodiments. The epitaxy reactor module 612 may control various epitaxy processes during a FET-making process, according to various embodiments. The oxide deposition module 606 and the epitaxy reactor module 618 may be stored in data storage 616, according to various embodiments. Additional modules may be included in the FET-making application, according to various embodiments.

The RAM 615 may include an operating system 619. Operating systems useful for record filtering according to embodiments of the present disclosure include UNIX®, Linux®, Microsoft XP™, AIX®, IBM's i5/OS™, and others. The operating system 619 is shown in RAM 615, but many components of such software typically are stored in non-volatile memory also, such as, for example, on a disk drive 616.

The computer 600 may also include disk drive adapter 620 coupled through expansion bus 632 and bus adapter 617 to processor 610 (and accompanying thread 602) and other components of the computer 600. Disk drive adapter 620 connects non-volatile data storage to the computer 600 in the form of disk drive 616. Disk drive adapters useful in computers include Integrated Drive Electronics (IDE) adapters, Small Computer System Interface (SCSI) adapters, Serial AT Attachment (SATA), and others. Non-volatile computer memory also may be implemented for as an optical disc drive, electrically erasable programmable read-only memory (so-called 'EEPROM' or 'Flash' memory), RAM drives, etc.

The data storage 616 may include one or more storage devices in a tiered or non-tiered configuration. The data storage 616 may include one or more memory chip thermal profile inputs that are received by the application and stored for later use by the FET-making application 614 through RAM 615.

The example computer 600 may include one or more input/output (I/O) adapters 622. I/O adapters implement user-oriented input/output through, for example, software drivers and computer hardware for controlling output to display devices such as computer display screens 624, as well as user input from user input devices 626 such as keyboards, mice, styli, or touchscreens, according to various embodiments. The example computer 600 may include a video adapter at 622, which is an example of an I/O adapter specially designed for graphic output to a display device 624 such as a display screen or computer monitor. The video adapter (I/O) would be connected to processor 610 through a bus adapter 617, and the front side bus 628, which is also a high-speed bus.

The example computer 600 includes a communications adapter 630 for data communications with other computers, for example, mobile devices 601, and for data communications with a data communications network 608. Such data communications may be carried out serially through RS-232 connections, through external buses such as a Universal Serial Bus (USB), through data communications networks such as IP data communications networks, and in other ways as will occur to those of skill in the art. Communications adapters implement the hardware level of data communications through which one computer sends data communications to another computer, directly or through a data communications network 608. Examples of communications adapters include modems for wired dial-up communications, Ethernet (IEEE 802.3) adapters for wired data communications network communications, and IEEE 802.77 adapters for wireless data communications network communications.

The descriptions of the various embodiments of the present disclosure have been presented for purposes of illustration, but are not intended to be exhaustive or limited to the embodiments disclosed. Many modifications and variations will be apparent to those of skill in the art without departing from the scope and spirit of the described embodiments. The terminology used herein was chosen to best explain the principles of the embodiments, the practical application or technical improvement over technologies found in the marketplace, or to enable others of skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 7:
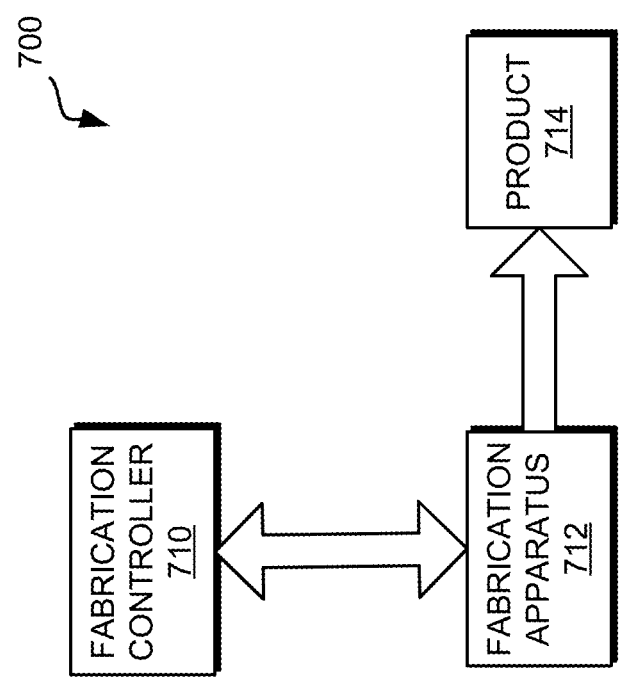
FIG. 7 depicts a block diagram of a FET fabrication system, according to various embodiments.

FIG. 7 depicts a block diagram of a FET fabrication system 700, according to various embodiments.

A fabrication controller 710 is communicatively connected to a fabrication apparatus 712. The fabrication controller 710 may be implemented by various computing devices or computer processes. For example, the computer 600 in FIG. 6 may represent an embodiment of the fabrication controller 710, according to various embodiments. The fabrication controller 710 may receive inputs from various sources, according to various embodiments. The fabrication apparatus 712 may produce a product 714, which may be one or more FETs, according to various embodiments.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method, comprising:
accessing a silicon germanium on insulator (SGOI) wafer having an nFET region and a pFET region, wherein the SGOI wafer has a silicon germanium (SiGe) layer of a first germanium (Ge) concentration, the SGOI wafer having a first oxide layer over the nFET and pFET regions;
removing the first oxide layer over the pFET region in response to accessing the SGOI wafer;
increasing the first Ge concentration in the SiGe layer of the first Ge concentration in the pFET region to a second Ge concentration in response to removing the first oxide layer over the pFET region;
removing the first oxide layer over the nFET region in response to increasing the first Ge concentration in the SiGe layer of the first Ge concentration in the pFET region;
recessing the SiGe layer of the first Ge concentration in the nFET region so that the SiGe layer in the nFET region is in plane with the SiGe layer of the second Ge concentration in the pFET region in response to removing the first oxide layer over the nFET region;
growing a silicon (Si) layer over the SGOI wafer in the nFET region in response to recessing the SiGe layer of the first Ge concentration in the nFET region; and
growing a SiGe layer of a third Ge concentration in the pFET region in response to growing a Si layer over the nFET region, wherein the SiGe layer of a third concentration is in plane with the grown Si layer in the nFET region.

2. The method of claim 1, further comprising, prior to accessing the SGOI:
annealing the nFET and pFET regions of the SiGe layer of the first Ge concentration of the SGOI wafer; and
relaxing the SiGe layer.

3. The method of claim 2, annealing the SiGe is accomplished by heating the SiGe layer to a temperature between 700 to 1250° C.

4. The method of claim 1, wherein increasing the first Ge concentration is accomplished by condensation of the SiGe.

5. The method of claim 1, wherein the SGOI wafer is created by:
a Smart Cut® process.

6. The method of claim 1, wherein the accessed SGOI wafer is formed by:
accessing a silicon on insulator (SOI) wafer;
growing a SiGe layer on the SOI wafer;
condensing the SiGe layer, which creates an oxide layer on the SiGe layer; and
stripping the oxide layer from the SiGe layer.

7. The method of claim 1, wherein removing the first oxide layer in the pFET region is accomplished by patterning over the pFET region.

8. The method of claim 1, wherein removing the first oxide layer in the nFET region is accomplished by patterning over the nFET region.

9. The method of claim 1, wherein recessing the SiGe layer of the first Ge concentration in the pFET region is accomplished by a hydrogen chloride (HCl) gas etch process.

10. The method of claim 1, wherein recessing the SiGe layer of the first Ge concentration in the pFET region is accomplished by a reactive ion etching (RIE) process.

11. The method of claim 1, further comprising releasing the nFET region and the pFET region at a same time.

12. A method, comprising:
accessing a silicon germanium on insulator (SGOI) wafer having an nFET region and a pFET region, wherein the SGOI wafer has a silicon germanium (SiGe) layer of a first germanium (Ge) concentration, the SGOI wafer having a first oxide layer over the nFET and pFET regions, wherein the SGOI wafer is formed by:
accessing a silicon on insulator (SOI) wafer;
growing a SiGe layer on the SOI wafer;
condensing the SiGe layer, which creates an oxide layer on the SiGe layer; and
stripping the oxide layer from the SiGe layer;
removing the first oxide layer over the pFET region by patterning over the pFET region in response to accessing the SGOI wafer;
increasing the first Ge concentration in the SiGe layer of the first Ge concentration in the pFET region to a second Ge concentration in response to removing the first oxide layer over the pFET region, wherein increasing the first Ge concentration is accomplished by condensation of the SiGe;
removing the first oxide layer over the nFET region by patterning over the nFET region in response to increasing the first Ge concentration in the SiGe layer of the first Ge concentration in the pFET region;
recessing the SiGe layer of the first Ge concentration in the nFET region using a hydrogen chloride (HCl) gas etch process so that the SiGe layer in the nFET region is in plane with the SiGe layer of the second Ge concentration in the pFET region in response to removing the first oxide layer over the nFET region;
growing a silicon (Si) layer over the SGOI wafer in the nFET region in response to recessing the SiGe layer of the first Ge concentration in the nFET region;
growing a SiGe layer of a third Ge concentration in the pFET region in response to growing a Si layer over the nFET region, wherein the SiGe layer of a third concentration is in plane with the grown Si layer in the nFET region; and
releasing the nFET region and the pFET region at a same time.

* * * * *